United States Patent [19]

Craig

[11] 4,152,640
[45] May 1, 1979

[54] TWO PHASE HIGH VOLTAGE INSULATION TESTING OF MULTIPHASE WINDINGS

[75] Inventor: William G. Craig, Munhall, Pa.

[73] Assignee: Westinghouse Electric Corp., Pittsburgh, Pa.

[21] Appl. No.: 836,173

[22] Filed: Sep. 23, 1977

[51] Int. Cl.$^2$ .................. G01R 31/12; G01R 31/06
[52] U.S. Cl. .................................................. 324/54
[58] Field of Search .................. 324/54, 55, 52, 51

[56] References Cited

U.S. PATENT DOCUMENTS

| | | | |
|---|---|---|---|
| 2,890,410 | 6/1959 | Holcomb | 324/55 X |
| 3,684,951 | 8/1972 | Harrold | 324/54 X |
| 3,860,866 | 1/1975 | Dornberger | 324/52 |

OTHER PUBLICATIONS

"IEEE Recommended Practice for Insulation Testing . . with High Direct Voltage", IEEE Std. 95-1977, pp. 1-28.

*Primary Examiner*—Gerard R. Strecker
*Attorney, Agent, or Firm*—G. H. Telfer

[57] ABSTRACT

Insulated multiphase electrical windings are tested by applying to both ends of one phase, a positive DC voltage for a fixed period of time and simultaneously to another phase an equal negative DC voltage is applied for the same fixed period of time and all remaining phases are grounded. The application of the positive and negative DC voltages is repeated until each phase of the multiphase windings has been tested with both a positive and negative voltage.

12 Claims, 4 Drawing Figures

TWO PHASE HIGH VOLTAGE INSULATION TESTING OF MULTIPHASE WINDINGS

BACKGROUND OF THE INVENTION

1. Field of the Invention

This invention relates to a method and apparatus for performing two phase high voltage insulation testing of multiphase windings such as those found on large electrical machinery.

2. Description of the Prior Art

At present, American National Standard Institute's Specification C50-10 as issued in 1975 and Institute of Electrical and Electronic Engineers' Specification 95 issued in 1975 are the industry standards for final insulation tests on wound high voltage electrical equipment and provide for applying twice the rated voltage plus 1 kilovolt to each phase for one minute while the other phases are grounded. As the demand increases for equipment with larger power ratings over the previously available units, the need for increasing the operating voltages of these machines becomes more apparent since the present level of load currents are near the maximum allowable limits. This is due primarily to the magnitude of the electromechanical forces involved with such high currents.

Limitation of the present high voltage test procedures becomes more significant as the rated voltages of large electrical equipment increase beyond 20 KV. In fact, at the present time, the size of electrical equipment such as a generator, for example, is substantially increased in size in order to obtain the necessary clearance and voltage holding capabilities for testing. This increase in size is not required for normal operating circumstances, especially for a generator which is operated in a hydrogen environment of four or more atmospheres.

The basic guideline for industry's standards for direct current insulation testing of large electrical equipment such as large AC rotating machinery is provided by the Institute of Electrical and Electronic Engineers, Specification No. 95, as issued 1975. The purpose of the guide is to provide uniform procedures for performing high direct voltage acceptance tests and routine maintenance tests on the main ground insulation of windings on large electrical machinery. In addition, the procedure provides uniform procedures for analysis of the variations in measuring current so that any possible relationship of the components of these variations to the conditions of the insulation can be more effectively studied.

The procedure provides for the application of a test voltage to both ends of one winding. The remaining windings are then grounded. The test voltage is applied for a period of one minute during which time the current flowing from the test voltage power source to the winding is monitored. It is through the monitoring of the current that a failure can be detected. A complete failure is usually indicated by a sharp capacitive discharge at the point of failure. There are times, however, when failure or partial failure may be indicated by a large abnormal change in the current reading or by erratic current indications being observed.

In addition to being able to perform the voltage test as described above, the procedure provides for performing a controlled overvoltage test, sometimes referred to as a "direct current leakage test" or a "step voltage test". This test is a high direct voltage test in which the voltage is increased in a specified manner during which time the measured current is observed. This type of test, done under suitable conditions, provides a record of the condition of the winding for present and future use and may predict breakdown voltage if it is within or slightly above the test voltage. Conclusions are reached by recognition of abnormalities or deviations in the curve of microamperes versus applied volts, plotted as the test progresses.

The controlled overvoltage test, initially involves the application of approximately one-third of the maximum test voltage. The next step is the determination of polarization index which is the ratio of the one minute current reading to the ten minute current reading of a particular winding. After the application of the voltage, the current is noted at the expiration of one minute and at ten minutes. The quotient that is derived by dividing the ten minute reading into the one minute reading is called the polarization index.

After the initial ten minute step, the uniform voltage test steps are conducted. The voltage is raised on the winding under test approximately one kilovolt per step. The voltage is held at this level for approximately one minute and then the test proceeds until the equivalent of the maximum test voltage of two times the rated voltage plus 1 KV is achieved. The test is then conducted on the next winding and repeated until all of the windings have been tested.

As an alternate to the above test method, IEEE Standard No. 95 provides for the situation where it is desirable to obtain only the true leakage current on a control overvoltage test. However, procedures require compromise to prevent allowing too brief a time at each voltage step or maintaining each voltage for a long time so that the absorption is practically complete and only the leakage current remains. The gradient time method uses a reasonable time and provides a result related to the true leakage current components.

This test procedure requires the initial application of a voltage step of approximately 30% of the maximum test voltage. This voltage is maintained constant for a period of ten minutes, during which time the measured current is observed and logged at 1 minute, 3.16 minutes and 10 minutes. The 3.16 minute reading may be extrapolated from a curve of the plotted current readings over the ten minute period. It is then required that the conduction component C of the measuring current be calculated by the equation:

$$C = \frac{(i_1 \times i_{10}) - (i_{3.16})^2}{i_1 + i_{10} - 2(i_{3.16})}.$$

where C is equal to the current at 1 minute times the current at 10 minutes minus the current at 3.16 minutes squared, the total being divided by the sum of the current at 1 minute plus the current at 10 minutes, minus two times the current at 3.16 minutes. By subtracting the value of C from the current at 1 minute and the current at 10 minutes the absorption currents for these current readings can be calculated. The absorption ratio is then determined by dividing into the absorption current at one minute, the absorption current at 10 minutes. By calculating the absorption ratio as described above, there are tables available such as Table I, which is taken from IEEE No. 95, which relate the absorption ratio to the amount of time that the remainder of the test voltages must be applied at each step. After the absorption ratio is determined, the test voltage is increased by a value of 20% and held for the period of time that is from Table I and each step thereafter is performed in a similar fashion.

There has been much work performed in the area of testing multiphase windings. Of these, U.S. Pat. No. 2,890,410 provides a method of testing a three phase machine by applying DC impulses of equal magnitude and opposite polarity simultaneously to each of two windings of the machine. A voltage detecting device is applied between either the neutral point or to a third terminal and ground. If no fault exists in the windings, the voltage pulses will cancel each other out at the voltage detecting point and the detector will read zero voltage. If a fault does exist, the voltages will be unbalanced and the detector will indicate a fault.

In U.S. Pat. Nos. 2,321,424 and 2,815,481, there is disclosed a method of testing by which DC surge voltages are applied across two windings of a three phase machine in order to test its insulation characteristics. The voltages are placed in series relationship between the test windings and ground, and the test voltage is above and below ground potential. The third winding is not directly grounded.

In U.S. Pat. No. 2,558,091 there is disclosed a method for testing for a discharge on high voltage windings where a voltage is applied across two windings. Here the applied voltage is AC with the winding being connected between the voltage source and ground. Also, there is additional test apparatus serially connected between the second winding and ground.

It is important that adequate testing be performed on new machinery to determine the sufficiency of each insulation mode, i.e., line to line and line to ground. It is felt that a more preferred test can be accomplished by applying to two phases simultaneously a positive and negative voltage with the remaining phases grounded. With a series of such tests, a complete machine insulation system could be proved adequate for the application for which it was designed by applying a lower test voltage than the current industry standard of two times the rated voltage plus one kilovolt.

SUMMARY OF THE INVENTION

Insulated multiphase electrical windings are tested by applying to both ends of one phase a positive DC voltage for a fixed period of time and simultaneously to another phase, a negative DC voltage of equal magnitude as that of the positive DC voltage is applied for the same fixed period of time and all remaining phases are grounded. The application of the positive and negative DC voltages is repeated until each phase of the multiphase windings has been tested with both a positive and negative voltage.

In addition, it is possible to test multiphase electrical windings by using AC voltages. The procedure for doing this would require testing each phase of the multiphase windings by applying one phase of a multiple phase AC source for a fixed period of time to both ends of one set of windings of the multiphase windings being tested, and then simultaneously applying a second phase of equal magnitude to both ends of another phase of the multiphase windings. All the remaining phases are grounded.

In addition, the two phase method of testing can also be used to obtain a true DC leakage current measurement during the application of a controlled overvoltage test.

The apparatus used for AC testing of the insulation consists of a multiple phase AC source with two phases connected to two test transformers. The voltages to the transformers are controlled by gang connect variable auto transformers. The voltages across the windings being tested are measured by either a high voltage AC voltmeter or a cathode ray oscilloscope. There is also a means provided for measuring the current to the windings being tested.

The apparatus used for DC testing of the insulation consists of a dual power supply with high voltage, low current output capabilities. The power supplies should have a variable output which can be controlled from a single source for adjusting the voltages and also, have a means of measuring the currents to the windings as well as the voltages across the windings.

Utilizing the two phase test method, the test voltage level can be reduced to 1.5 times the rated voltage and provide a margin of over 200% of the normal operating stresses in the final winding test. Using a 1.5 times the rated voltage final test, the present voltage design criterion could be extended to 40 KV without significant changes to the present standards for the creepage, strike and voltage gradient distances for 26 KV.

BRIEF DESCRIPTION OF THE DRAWINGS

For a better understanding of the invention, reference may be had to the preferred embodiments, exemplary of the invention, shown in the accompanying drawings, in which.

DESCRIPTION OF THE PREFERRED EMBODIMENT

Figure 1:
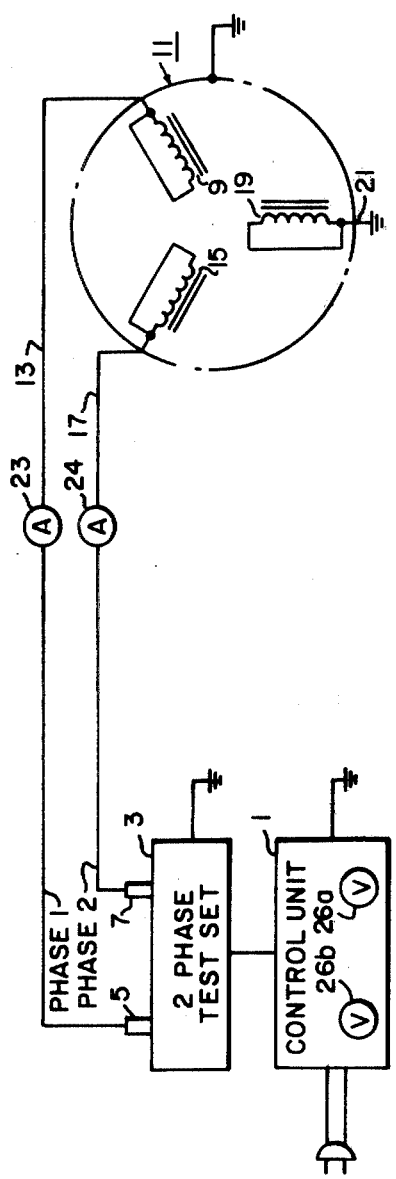
FIG. 1 is a block diagram of a two phase test set connected to two phases of a multiphase machine.

Referring to FIG. 1, there is a control unit 1 which interfaces to the two phase test set 3. The two phase test set has a phase one output 5 and a phase two output 7. Phase one is connected to both ends of a single phase 9 of a multiphase machine 11 by conductor means 13. Phase two is connected to both ends of another phase 15 by conductor means 17 and the remaining phase 19 of the multiphase machine 11 is connected to ground by conductor means 21.

All requirements for safety, preparation of the machine for testing, and precautions taken after the completion of the test should be followed as established by industry standards such as the IEEE Specification No. 95.

The test voltage is applied simultaneously to both phases through control unit 1 and should be gradual, should avoid exceeding the maximum test set current, and should avoid unnecessary tripping of the overcurrent devices (not shown) which would cause undesirable surges. Duration of the test should be for a fixed period of time of approximately one minute. Reduction of the test voltage at the end of the test should be conducted from the control unit 1 and not be abrupt. The voltage should be allowed to decay at least 50% before the winding is grounded.

Figure 2:
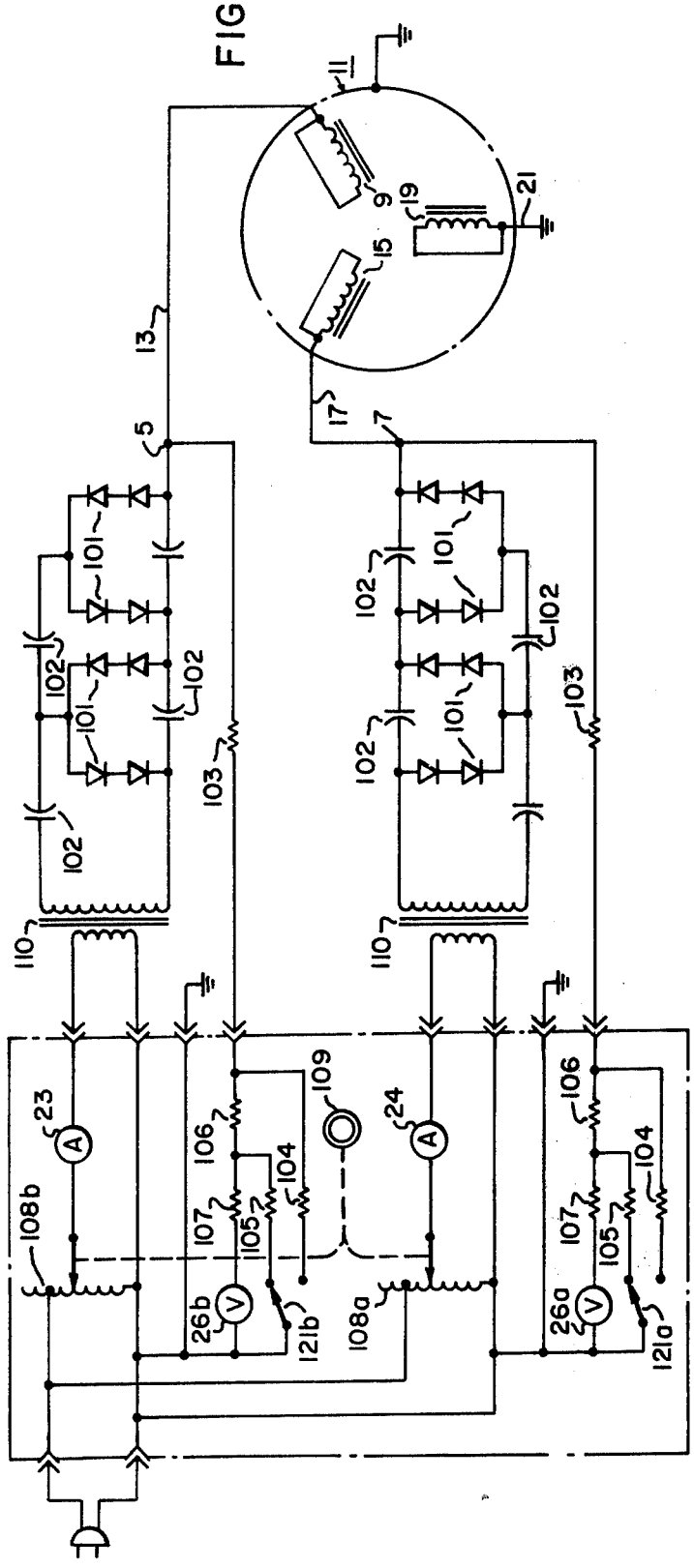
FIG. 2 is a schematic diagram of a two phase DC test set connected to two phases of a multiphase machine.

The test set as shown in FIG. 2 is a DC set consisting of a dual output supply with the opposite polarity of each output grounded. Each output has a separate metering 26a and 26b for measuring voltage and meters 23 and 24 for measuring current. The control unit is constructed so that either a single or dual control may be used. A knob with a drive means 109 is connected to variable voltage controllers such as variable auto transformers 108a and 108b. Each unit may be used individually or with the gang control knob 109. The outputs of each variable transformer are applied to a step-up transformer 110 after which the voltage is converted to a high DC level voltage by means of a high voltage rectifier network such as a Cockcroft-Walton circuit as shown in FIG. 2 which consists of a plurality of capacitors 102 and diodes 101. To measure the output of each phase of each polarity of each power supply, there is a resistor divider network in series with a voltmeter 26a or 26b and comprising of resistors 103 and 107, 106. Resistors 104 and 105 are meter shunt resistors and switch means 121a and 121b facilitate the changing of the meter's range.

In the embodiment as shown in FIG. 2, the positive output is provided at terminal 7 and the negative output is provided at terminal 5. Polarity is essentially determined by the arrangements of the diodes 101 in the Cockcroft-Walton circuit.

The high voltage components which include the Cockcroft-Walton circuits and the step-up transformers 110 should be insulated in either a gas or a liquid medium, depending upon the power output requirements. Smaller size units (100 KV, 10 milliamperes or less) can be air insulated and contained in an insulating housing made of a material such as fiberglass. The medium size units (100 KV, 10 milliamperes to 100 milliamperes) should be housed in containers filled with insulating gas such as sulfur hexafluoride, $SF_6$. Large size units over 100 kilovolts and 100 milliamperes should be housed in insulation fluid-filled tanks.

In addition to being able to perform the voltage test as described above, FIG. 2 is also capable of performing a controlled overvoltage test. The controlled overvoltage test, involves the application of approximately one-third of the final test voltages, which as was stated before is approximately 1.5 times the rated voltage of the machine, to two separate windings of the unit to be tested. In the case of FIG. 2, winding 15 is connected to a positive terminal 7 by conduit means 13 and winding 9 is connected to a negative terminal 5 by conduit means 17. The winding 19 is grounded by conduit means 21.

The next step is the determination of the polarization index which is the ratio of the one minute current reading to the ten minute current reading for the particular winding being tested. Each winding is checked with both a positive and negative voltage, and under normal conditions it is immaterial whether the positive or the negative current readings are selected. However, using both positive and negative readings provides additional data which can be used to verify not only the insulation but also provides a check of the test instruments. After the simultaneous application of the voltages, the current is noted on one of the meters, either 23 or 24 or both, at the expiration of one minute and at ten minutes. The quotient that is derived by dividing the ten minute reading into the one minute reading is called the polarization index.

After the initial ten minute step, the uniform voltage test steps are performed. Watching voltmeters 26a and 26b, and turning knob 109, the voltage is raised on each winding approximately one kilovolt per step. The voltage is held at each step or level for approximately one minute and then raised again until the maximum test voltage of 1.5 times the rated voltage is achieved. After following the standard safety procedures, the test hookup is then moved sequentially to the next winding to be tested. For example line 13 would be connected to winding 19, line 17 would be connected to winding 9, and ground line 21 would be connected to winding 15, and the test would be repeated until each winding has been checked with both a positive and a negative voltage.

A variation of the controlled overvoltage test can also be performed using the two phase DC method of testing. This would require performing essentially the steps that are used to perform controlled over-voltage test. However, there are some differences rather than calculating the polarization index, the absorption ratio is calculated. For each absorption ratio there is a variable time for conducting each voltage step. This time is provided in Table I for most absorption ratios.

Referring again to FIG. 2, the initial voltage step is approximately 30% of the maximum rated test voltage which once again is 1.5 times the rated voltage. After setting this value, the measured current from either meters 24, 23 or both is noted at the expiration of one minute, 3.16 minutes, and 10 minutes; to facilitate the measurement at 3.16, several points are collected over the ten minute time span and plotted on a curve with the 3.16 point being extrapolated off the curve. After this portion of the test is completed, the voltage knob 109 is adjusted to increase the voltage output by 20% and the conduction component (C) of the measured current is calculated for each winding by the equation:

$$C = \frac{(i_1 \times i_{10}) - (i_{3.16})^2}{i_1 + i_{10} - 2(i_{3.16})}.$$

The absorption currents for one minute and ten minutes are calculated by subtracting C, the conduction component, from the one minute and ten minute current reading. The absorption ratio is achieved by dividing the absorption current at ten minutes into the absorption current at one minute.

Utilizing the elapsed time at the conclusion of each voltage step which is contained in the IEEE No. 95 specification and Table I, and relates the absorption ratio for each winding to the test time for each step, each step is increased by 20%. Once again, either the positive or negative current meters can be used in obtaining the values for calculation of the absorption ratio. However, once the choice is made it must be used through the remainder of the test. Using both positive and negative readings provides additional data which can be used to verify the test and to provide a check of the test instruments. The test of course, is repeated until each winding has had both a positive and a negative voltage applied to it.

Figure 3:
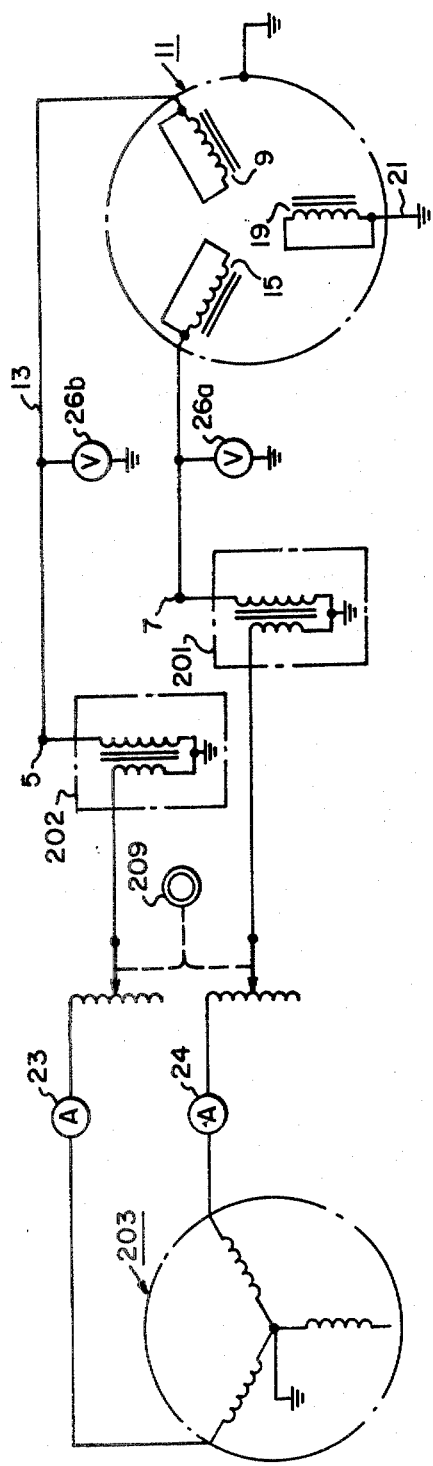
FIG. 3 is a schematic diagram of a two phase AC test set connected to two phases of a multiphase machine.

FIG. 3 is a test set which utilizes two phases from a three phase AC voltage source. It is very important to note that the voltage sources for both the DC test and the AC test must be well regulated. A two phase variable Ac source 203 is applied to test transformer 201 and transformer 202. Terminal 5 of the first test transformer 202 is connected to both ends of windings 15 by conduit means 13 and terminal 7 of test transformer 201 is connected to both ends of winding 9 by conduit means 17. Winding 19 is connected to ground through conduit means 21. Ampmeters 23 and 24 measure the current to the windings and voltage controller 209 controls the AC voltages to the test transformers which are observed through voltage metering means 26a and 26b. In this case 26a and 26b can easily be an instrument such as a cathode ray oscilloscope. The AC voltages are applied for a fixed period of time usually in the order of one minute, and at a RMS voltage of 1.5 times the rates voltage of the machine.

Figure 4:
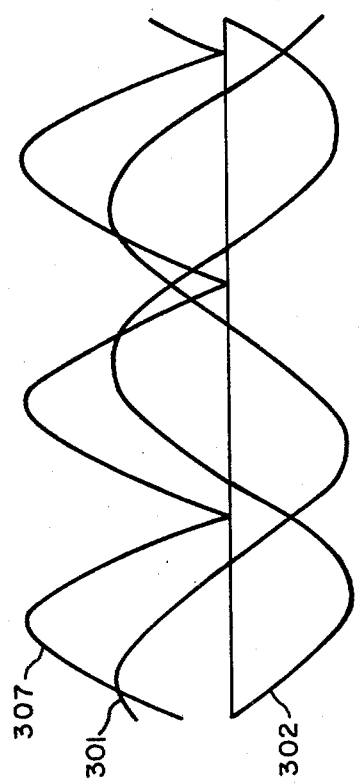
FIG. 4 is a diagram of the voltage relationship between the two phases when the apparatus of FIG. 3 is used.

FIG. 4 is a voltage diagram of the relationship between the different phases of the test voltages. Curves 301 and 302 represent the voltages applied between phases 15 and 9, respectively. Curve 307 represents the differential of voltage appearing between phases 15 and 9.

Using the standard safety precautions, the test should be conducted on each winding, and be repeated moving the terminals from winding to winding until each set of windings of the machine 11 have been tested with both phases of the AC test transformers.

Table A1

| Voltage Percent of First Step | Elapsed Time at the Conclusion of Each Voltage Step Absorption Ratio N | | | | | | | | | | | | | | | |
|---|---|---|---|---|---|---|---|---|---|---|---|---|---|---|---|---|
| | 2 | | 3 | | 4 | | 5 | | 6 | | 7 | | 8 | | 9 | |
| | min | (s) | (min) | (s) | (min) | (s) | (min) | (s) | (min) | (s) | (min) | (s) | (min) | (s) | (min) | (s) |
| 100 | 10 | | 10 | | 10 | | 10 | | 10 | | 10 | | 10 | | 10 | |
| 120 | 13 | 14 | 13 | 27 | 13 | 36 | 13 | 44 | 13 | 49 | 13 | 54 | 13 | 58 | 14 | 2 |
| 140 | 15 | 56 | 16 | 21 | 16 | 39 | 16 | 53 | 17 | 4 | 17 | 14 | 17 | 22 | 17 | 30 |
| 160 | 18 | 17 | 18 | 55 | 19 | 21 | 19 | 42 | 19 | 59 | 20 | 13 | 20 | 25 | 20 | 36 |
| 180 | 20 | 24 | 21 | 12 | 21 | 47 | 22 | 14 | 22 | 37 | 22 | 56 | 23 | 12 | 23 | 26 |
| 200 | 22 | 19 | 23 | 18 | 24 | 1 | 24 | 34 | 25 | 2 | 25 | 25 | 25 | 46 | 26 | 4 |
| 220 | 24 | 4 | 25 | 14 | 26 | 4 | 26 | 43 | 27 | 17 | 27 | 45 | 28 | 9 | 28 | 31 |
| 240 | 25 | 42 | 27 | 1 | 27 | 59 | 28 | 45 | 29 | 23 | 29 | 55 | 30 | 24 | 30 | 49 |
| 260 | 27 | 12 | 28 | 41 | 29 | 47 | 30 | 38 | 31 | 21 | 31 | 58 | 32 | 30 | 32 | 59 |
| 280 | 28 | 37 | 30 | 15 | 31 | 28 | 32 | 25 | 33 | 13 | 33 | 54 | 34 | 30 | 35 | 2 |
| 300 | 29 | 57 | 31 | 44 | 33 | 3 | 34 | 7 | 34 | 59 | 35 | 44 | 36 | 24 | 36 | 59 |
| 320 | 31 | 12 | 33 | 8 | 34 | 34 | 35 | 43 | 36 | 40 | 37 | 29 | 38 | 12 | 38 | 51 |
| 340 | 32 | 23 | 34 | 27 | 36 | 0 | 37 | 14 | 38 | 16 | 39 | 9 | 39 | 56 | 40 | 38 |
| 360 | 33 | 31 | 35 | 43 | 37 | 22 | 38 | 41 | 39 | 48 | 40 | 45 | 41 | 35 | 42 | 20 |
| 380 | 34 | 35 | 36 | 55 | 38 | 40 | 40 | 5 | 41 | 10 | 42 | 17 | 43 | 11 | 43 | 58 |
| 400 | 35 | 36 | 38 | 4 | 39 | 55 | 41 | 25 | 42 | 40 | 43 | 45 | 44 | 42 | 45 | 33 |
| 420 | 36 | 35 | 39 | 10 | 41 | 7 | 42 | 42 | 44 | 2 | 45 | 10 | 46 | 11 | 47 | 5 |
| 440 | 37 | 31 | 40 | 14 | 42 | 17 | 43 | 56 | 45 | 20 | 46 | 32 | 47 | 36 | 48 | 33 |
| 460 | 38 | 25 | 41 | 15 | 43 | 23 | 45 | 8 | 46 | 35 | 47 | 51 | 48 | 58 | 49 | 58 |
| 480 | 39 | 17 | 42 | 14 | 44 | 28 | 46 | 17 | 47 | 48 | 49 | 8 | 50 | 18 | 51 | 21 |
| 500 | 40 | 8 | 43 | 11 | 45 | 30 | 47 | 23 | 48 | 59 | 50 | 22 | 51 | 35 | 52 | 41 |
| 520 | 40 | 56 | 44 | 6 | 46 | 30 | 48 | 28 | 50 | 8 | 51 | 34 | 52 | 51 | 53 | 59 |
| 540 | 41 | 42 | 44 | 58 | 47 | 29 | 49 | 31 | 51 | 14 | 52 | 44 | 54 | 3 | 55 | 15 |
| 560 | 42 | 28 | 45 | 50 | 48 | 25 | 50 | 31 | 52 | 19 | 53 | 52 | 55 | 14 | 56 | 28 |
| 580 | 43 | 11 | 46 | 40 | 49 | 20 | 51 | 30 | 53 | 21 | 54 | 58 | 56 | 23 | 57 | 40 |
| 600 | 43 | 54 | 47 | 28 | 50 | 13 | 52 | 28 | 54 | 22 | 56 | 2 | 57 | 30 | 58 | 50 |
| 620 | 44 | 35 | 48 | 15 | 51 | 4 | 53 | 24 | 55 | 22 | 57 | 5 | 58 | 36 | 59 | 58 |
| 640 | 45 | 15 | 49 | 1 | 51 | 54 | 54 | 18 | 56 | 19 | 58 | 6 | 59 | 40 | 61 | 4 |
| 660 | 45 | 53 | 49 | 45 | 52 | 44 | 55 | 11 | 57 | 16 | 59 | 5 | 60 | 42 | 62 | 9 |
| 680 | 46 | 31 | 50 | 28 | 53 | 32 | 56 | 3 | 58 | 11 | 60 | 3 | 61 | 43 | 63 | 13 |
| 700 | 47 | 8 | 51 | 10 | 54 | 18 | 56 | 53 | 59 | 5 | 61 | 0 | 62 | 43 | 64 | 15 |
| 720 | 47 | 43 | 51 | 51 | 55 | 4 | 57 | 42 | 59 | 58 | 61 | 56 | 63 | 41 | 65 | 16 |
| 740 | 48 | 18 | 52 | 32 | 55 | 48 | 58 | 30 | 60 | 49 | 62 | 50 | 64 | 38 | 66 | 15 |
| 760 | 48 | 52 | 53 | 11 | 56 | 32 | 59 | 18 | 61 | 39 | 63 | 43 | 65 | 34 | 67 | 13 |
| 780 | 49 | 25 | 53 | 49 | 57 | 14 | 60 | 3 | 62 | 28 | 64 | 35 | 66 | 25 | 68 | 10 |
| 800 | 49 | 58 | 54 | 26 | 57 | 55 | 60 | 48 | 63 | 17 | 65 | 26 | 67 | 22 | 69 | 6 |
| 820 | 50 | 29 | 55 | 3 | 58 | 36 | 61 | 33 | 64 | 4 | 66 | 16 | 68 | 14 | 70 | 1 |
| 840 | 51 | 0 | 55 | 38 | 59 | 16 | 62 | 16 | 64 | 50 | 67 | 6 | 69 | 6 | 70 | 55 |
| 860 | 51 | 30 | 16 | 13 | 59 | 55 | 62 | 58 | 65 | 35 | 67 | 54 | 69 | 57 | 71 | 48 |
| 880 | 52 | 0 | 56 | 40 | 60 | 33 | 63 | 40 | 66 | 20 | 68 | 41 | 70 | 47 | 72 | 40 |
| 900 | 52 | 29 | 57 | 21 | 61 | 10 | 64 | 20 | 67 | 6 | 69 | 27 | 71 | 35 | 73 | 31 |
| 920 | 52 | 57 | 57 | 54 | 61 | 46 | 65 | 0 | 67 | 46 | 70 | 13 | 72 | 23 | 74 | 22 |
| 940 | 53 | 25 | 58 | 26 | 62 | 23 | 65 | 39 | 68 | 29 | 70 | 58 | 73 | 10 | 75 | 11 |
| 960 | 53 | 53 | 58 | 58 | 62 | 58 | 66 | 18 | 69 | 10 | 71 | 41 | 73 | 57 | 75 | 59 |
| 980 | 54 | 20 | 59 | 29 | 63 | 32 | 66 | 56 | 69 | 50 | 72 | 24 | 74 | 42 | 76 | 46 |

| Voltage Percent of First Step | Absorption Ratio N | | | | | | | | | | | | | | |
|---|---|---|---|---|---|---|---|---|---|---|---|---|---|---|---|
| | 10 | | 11 | | 12 | | 13 | | 14 | | 15 | | 16 | | 20 | |
| | (min) | (s) | (min) | (s) | (min) | (s) | (min) | (s) | (min) | (s) | (min) | (s) | (min) | (s) | (min) | (s) |
| 100 | 10 | | 10 | | 10 | | 10 | | 10 | | 10 | | 10 | | 10 | |
| 120 | 14 | 5 | 14 | 8 | 14 | 10 | 14 | 13 | 14 | 15 | 14 | 17 | 14 | 19 | 14 | 25 |
| 140 | 17 | 36 | 17 | 42 | 17 | 47 | 17 | 52 | 17 | 56 | 18 | 0 | 18 | 4 | 18 | 17 |
| 160 | 20 | 46 | 20 | 54 | 21 | 2 | 21 | 9 | 21 | 16 | 21 | 22 | 21 | 28 | 21 | 48 |
| 180 | 23 | 39 | 23 | 51 | 24 | 1 | 24 | 11 | 24 | 20 | 24 | 29 | 24 | 36 | 25 | 3 |
| 200 | 26 | 20 | 26 | 34 | 26 | 48 | 27 | 0 | 27 | 11 | 27 | 22 | 27 | 32 | 28 | 5 |
| 220 | 28 | 50 | 29 | 7 | 29 | 23 | 29 | 38 | 29 | 52 | 30 | 4 | 30 | 16 | 30 | 57 |
| 240 | 31 | 11 | 31 | 31 | 31 | 50 | 32 | 7 | 32 | 23 | 32 | 38 | 32 | 51 | 33 | 39 |
| 260 | 33 | 24 | 33 | 47 | 34 | 8 | 34 | 28 | 34 | 46 | 35 | 3 | 35 | 19 | 36 | 13 |
| 280 | 35 | 30 | 35 | 56 | 36 | 20 | 36 | 42 | 37 | 2 | 37 | 21 | 37 | 39 | 38 | 41 |
| 300 | 37 | 31 | 37 | 59 | 38 | 26 | 38 | 50 | 39 | 12 | 39 | 33 | 39 | 53 | 41 | 1 |
| 320 | 39 | 25 | 39 | 57 | 40 | 26 | 40 | 52 | 41 | 17 | 41 | 40 | 42 | 2 | 43 | 17 |
| 340 | 41 | 15 | 41 | 49 | 42 | 21 | 42 | 49 | 43 | 16 | 43 | 41 | 44 | 5 | 45 | 27 |
| 360 | 43 | 0 | 43 | 37 | 44 | 11 | 44 | 42 | 45 | 11 | 45 | 38 | 46 | 4 | 47 | 32 |
| 380 | 44 | 42 | 45 | 21 | 45 | 57 | 46 | 31 | 47 | 2 | 47 | 31 | 47 | 58 | 49 | 33 |

Table A1-continued

| | | | | | Elapsed Time at the Conclusion of Each Voltage Step | | | | | | | | | |
|---|---|---|---|---|---|---|---|---|---|---|---|---|---|---|
| 400 | 46 | 19 | 47 | 1 | 47 | 40 | 48 | 16 | 48 | 49 | 49 | 20 | 49 | 49 | 51 | 30 |
| 420 | 47 | 53 | 48 | 38 | 49 | 19 | 49 | 57 | 50 | 32 | 51 | 5 | 51 | 36 | 53 | 24 |
| 440 | 49 | 24 | 50 | 11 | 50 | 55 | 51 | 35 | 52 | 12 | 52 | 47 | 53 | 20 | 55 | 14 |
| 460 | 50 | 52 | 51 | 42 | 52 | 28 | 53 | 10 | 53 | 49 | 54 | 26 | 55 | 1 | 57 | 1 |
| 480 | 52 | 18 | 53 | 10 | 53 | 58 | 54 | 42 | 55 | 23 | 56 | 2 | 56 | 38 | 58 | 45 |
| 500 | 53 | 41 | 54 | 35 | 55 | 25 | 56 | 11 | 56 | 55 | 57 | 36 | 58 | 14 | 60 | 27 |
| 520 | 55 | 1 | 55 | 58 | 56 | 50 | 57 | 39 | 58 | 24 | 59 | 6 | 59 | 46 | 62 | 6 |
| 540 | 56 | 19 | 57 | 18 | 58 | 13 | 59 | 4 | 59 | 51 | 60 | 35 | 61 | 17 | 63 | 42 |
| 560 | 57 | 35 | 58 | 37 | 59 | 34 | 60 | 26 | 61 | 15 | 62 | 1 | 62 | 45 | 65 | 16 |
| 580 | 58 | 50 | 59 | 53 | 60 | 52 | 61 | 47 | 62 | 38 | 63 | 26 | 64 | 11 | 66 | 48 |
| 600 | 60 | 2 | 61 | 8 | 62 | 9 | 63 | 6 | 63 | 59 | 64 | 48 | 65 | 35 | 68 | 18 |
| 620 | 61 | 12 | 62 | 21 | 63 | 24 | 64 | 23 | 65 | 17 | 66 | 9 | 66 | 57 | 69 | 46 |
| 640 | 62 | 21 | 63 | 32 | 64 | 37 | 65 | 38 | 66 | 34 | 67 | 27 | 68 | 17 | 71 | 13 |
| 660 | 63 | 29 | 64 | 41 | 65 | 49 | 66 | 51 | 67 | 50 | 68 | 44 | 69 | 30 | 72 | 37 |
| 680 | 64 | 35 | 65 | 50 | 66 | 59 | 68 | 3 | 69 | 3 | 70 | 0 | 70 | 53 | 74 | 0 |
| 700 | 65 | 39 | 66 | 56 | 68 | 7 | 69 | 14 | 70 | 16 | 71 | 14 | 72 | 9 | 75 | 21 |
| 720 | 66 | 42 | 68 | 1 | 69 | 15 | 70 | 23 | 71 | 27 | 72 | 26 | 73 | 23 | 76 | 41 |
| 740 | 67 | 44 | 69 | 5 | 70 | 20 | 71 | 30 | 72 | 36 | 73 | 38 | 74 | 36 | 77 | 59 |
| 760 | 68 | 44 | 70 | 8 | 71 | 25 | 72 | 37 | 73 | 44 | 74 | 47 | 75 | 47 | 79 | 16 |
| 780 | 69 | 43 | 71 | 9 | 72 | 28 | 73 | 42 | 74 | 51 | 75 | 56 | 76 | 57 | 80 | 32 |
| 800 | 70 | 42 | 72 | 9 | 73 | 30 | 74 | 46 | 75 | 57 | 77 | 3 | 78 | 6 | 81 | 46 |
| 820 | 71 | 39 | 73 | 8 | 74 | 32 | 75 | 49 | 77 | 1 | 78 | 9 | 79 | 14 | 82 | 59 |
| 840 | 72 | 35 | 74 | 7 | 75 | 32 | 76 | 51 | 78 | 5 | 79 | 14 | 80 | 20 | 84 | 11 |
| 860 | 73 | 30 | 75 | 4 | 76 | 30 | 77 | 51 | 79 | 7 | 80 | 18 | 81 | 26 | 85 | 22 |
| 880 | 74 | 24 | 76 | 0 | 77 | 28 | 78 | 51 | 80 | 8 | 81 | 21 | 92 | 30 | 86 | 32 |
| 900 | 75 | 17 | 76 | 55 | 78 | 25 | 79 | 50 | 81 | 9 | 82 | 23 | 83 | 33 | 87 | 41 |
| 920 | 76 | 10 | 77 | 49 | 79 | 21 | 80 | 47 | 82 | 8 | 83 | 24 | 84 | 36 | 88 | 49 |
| 940 | 77 | 1 | 78 | 42 | 80 | 17 | 81 | 44 | 83 | 7 | 84 | 24 | 85 | 37 | 89 | 55 |
| 960 | 77 | 52 | 79 | 35 | 81 | 11 | 82 | 40 | 84 | 4 | 85 | 23 | 86 | 38 | 91 | 1 |
| 980 | 78 | 41 | 80 | 26 | 82 | 4 | 83 | 35 | 85 | 1 | 86 | 21 | 87 | 37 | 92 | 5 |

NOTES:
(1) Time at end of first step: 10 min
(2) Voltage increment: 20 percent of first step.

What I claim is:

1. A method of testing insulated, disconnected phase windings of a multiphase machine, comprising:
   connecting both ends of a first phase winding together;
   connecting both ends of a second phase winding together;
   applying simultaneously for a pedetermined period of time, while said windings are so connected, a positive DC voltage of predetermined magnitude to the first phase winding and a negative DC voltage of equal magnitude to the second phase winding; and
   measuring current flowing in series with said first and second phase windings.

2. The method of claim 1 further comprising:
   reconnecting said windings in successive steps so that each other pair of phase windings of the multiphase machine are connected for application of said voltages as described for said first and second phase windings.

3. The method of claim 1 wherein said voltages are applied for a period within the range of one to ten minutes, and said current is measured at predetermined times during the application of said voltages.

4. The method of claim 1 wherein said voltages are increased in predetermined steps up to the test voltage, and the current is measured at predetermined times during the application of each one of said voltage steps.

5. The method of claim 4 wherein said times are selected from a predetermined time schedule based on the absorption current.

6. The method of claim 4 further comprising measuring the polarization index produced by said voltages.

7. A method of testing insulated, disconnected phase windings of a multiphase machine, comprising:
   connecting both ends of a first phase winding together;
   connecting both ends of a second phase winding together;
   applying simultaneously for a predetermined period of time, while said windings are so connected, a first phase of a multiphase AC voltage source of a predetermined magnitude to the first phase winding, and a second phase of the multiphase AC voltage source, of equal magnitude, to the second phase of said multiphase machine; and
   measuring current flowing in series with said first and second phase windings.

8. The method of claim 7 further comprising:
   reconnecting said windings in successive steps so that each other pair of phase windings of the multiphase machine are connected for application of said voltages as described for said first and second phase windings.

9. The method of claim 7 wherein said voltages are applied for a period within the range of one to ten minutes, and said current is measured at intervals during the application of said voltages.

10. The method of claim 7 wherein said voltages are increased in predetermined steps up to the test voltage, and the current is measured at predetermined times during the application of each one of said voltage steps.

11. In combination: a plurality of insulated, disconnected phase windings of a multiphase machine; and a test apparatus comprising
   a voltage supply having first and second outputs, with opposite polarities of said first and second outputs being grounded;
   a variable voltage controller connected electrically in series between one of said phase windings and said first output from the supply;
   a second variable voltage controller connected electrically in series between another of the phase windings and said second output from the supply;

means for measuring the current in series with the phase windings to be tested.

12. In combination: a plurality of insulated, disconnected phase windings of a multiphase machine; and a test apparatus comprising
- a variable multiphase AC voltage supply;
- a voltage regulator for controlling the output from, and electrically connected in series with, the supply;
- a high voltage step up transformer which impresses one phase of the variable multiphase AC source from the voltage regulator across the first of said phase windings of the multiphase electrical machine;
- a second high voltage step up transformer to impress another phase of the variable multiphase AC voltage source from the voltage regulator across the second of said phase windings of the multiphase electrical machine;
- means for measuring the voltage and current flowing in series with said first and second phase windings;
- means for grounding the remaining windings of said multiphase electrical machine.

* * * * *